United States Patent
Rao

(10) Patent No.: US 11,588,131 B2
(45) Date of Patent: Feb. 21, 2023

(54) DISPLAY PANEL AND DISPLAY DEVICE HAVING ANTI-OVERFLOW PORTION AROUND TERMINALS IN NON-DISPLAY AREA

(71) Applicant: WUHAN CHINA STAR OPTOELECTRONICS SEMICONDUCTOR DISPLAY TECHNOLOGY CO., LTD., Wuhan (CN)

(72) Inventor: Ping Rao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 404 days.

(21) Appl. No.: 16/758,423

(22) PCT Filed: Mar. 27, 2020

(86) PCT No.: PCT/CN2020/081664
§ 371 (c)(1),
(2) Date: Apr. 23, 2020

(87) PCT Pub. No.: WO2021/168976
PCT Pub. Date: Sep. 2, 2021

(65) Prior Publication Data
US 2022/0320460 A1 Oct. 6, 2022

(30) Foreign Application Priority Data
Feb. 27, 2020 (CN) .......................... 202010123787.6

(51) Int. Cl.
*H01L 51/52* (2006.01)
(52) U.S. Cl.
CPC ...... *H01L 51/5246* (2013.01); *H01L 51/5293* (2013.01)
(58) Field of Classification Search
CPC combination set(s) only.
See application file for complete search history.

(56) References Cited

U.S. PATENT DOCUMENTS

2007/0052110 A1* 3/2007 Lu ........................... H01L 24/29
257/E23.021
2011/0115984 A1* 5/2011 Tsubata ............... G02F 1/13392
348/731

(Continued)

FOREIGN PATENT DOCUMENTS

CN 104297963 A 1/2015
CN 206490063 U 9/2017

(Continued)

*Primary Examiner* — Nduka E Ojeh
(74) *Attorney, Agent, or Firm* — PV IP PC; Wei Te Chung; Ude Lu

(57) ABSTRACT

The present application discloses a display panel and a display device. The display panel includes a display area and a non-display area; the non-display area includes a bonding area away from the display area, and a plurality of terminals are disposed in the bonding area; and the non-display area further includes an anti-overflow portion disposed around the plurality of terminals. The present application prevents the problem of ACF overflow by disposing the anti-overflow portion around the plurality of terminals in the non-display area, such that the peeling of the glass substrate is facilitated, and the yield of the product is improved.

18 Claims, 3 Drawing Sheets

(56) References Cited

U.S. PATENT DOCUMENTS

2016/0278210 A1* 9/2016 Tsuruoka ............... H05K 1/142
2019/0326549 A1* 10/2019 Kokame ............. H01L 27/3258

FOREIGN PATENT DOCUMENTS

| CN | 107819014 A | 3/2018 |
| CN | 208607473 U | 3/2019 |
| CN | 109769049 A | 5/2019 |
| CN | 109860224 A | 6/2019 |
| WO | 2017193868 A1 | 11/2017 |

* cited by examiner

DISPLAY PANEL AND DISPLAY DEVICE HAVING ANTI-OVERFLOW PORTION AROUND TERMINALS IN NON-DISPLAY AREA

BACKGROUND OF INVENTION

Field of Invention

The present application relates to a field of display, in particular to a field of display technology, and specifically to a display panel and a display device.

Description of Prior Art

With the improvement of living standards, flexible organic light-emitting diode (OLED) displays are increasingly sought after by people. An anisotropic conductive film (ACF) is a kind of conductive adhesive used to bond a chip to a display panel on the flexible display, to play a role of conduction between upper and lower layers.

At present, the manufacturing process is generally to peel off a glass substrate after the bonding process. However, due to the frequent occurrence of overflow of the ACF, it will cause difficulty in peeling the glass substrate and impact a yield of a module product.

Therefore, there is an urgent need to develop a display panel and a display device a to solve the above technical problem.

SUMMARY OF INVENTION

The present application provides a display panel and a display device to solve the technical problem that the exiting manufacturing process is generally to peel off a glass substrate after the bonding process, but the frequent occurrence of overflow of the ACF will cause difficulty in peeling the glass substrate and impact a yield of a module product.

In order to solve the above problem, the technical solutions provided by the present application are as follows:

A display panel, including a display area and a non-display area,
  wherein the non-display area includes a bonding area away from the display area, and a plurality of terminals are disposed in the bonding area; and
  wherein, the non-display area further includes an anti-overflow portion disposed around the plurality of terminals.

In the display panel according the present application, the anti-overflow portion includes a continuous channel disposed around the bonding area.

In the display panel according the present application, the bonding area is provided with a substrate, a first planarization layer disposed on the substrate, the plurality of terminals disposed on the first planarization layer, a second planarization layer disposed on the plurality of terminals, and the anti-overflow portion disposed on the second planarization layer; and
  wherein, the anti-overflow portion includes at least one first groove, and the first groove is evenly arranged in the non-display area except for an area where the plurality of terminals are located.

In the display panel according the present application, in a top view of the display panel, a diameter of a circumcircle of the first groove between adjacent ones of the terminals is smaller than that a diameter of conductive particles in an object to be overflowed; and
  wherein, a difference between the diameter of the conductive particles in the object to be overflowed and the diameter of the circumcircle of the first groove is greater than 3 μm.

In the display panel according the present application, the second planarization layer includes at least one first via hole, and
  the first via hole penetrates the second planarization layer to expose each of the terminals; and
  wherein, the first via hole and the terminals are in a one-to-one correspondence, and each of the terminals is electrically connected to a printed circuit board of the display panel through the first via hole.

In the display panel according the present application, the first groove is continuously disposed along a periphery of the plurality of terminals in a top view of the display panel.

In the display panel according the present application, the first groove is located between adjacent ones of the terminals in a top view of the display panel.

In the display panel according the present application, in a top view of the display panel, an opening shape of the first groove on the second planarization layer includes a circle, a triangle, or a rectangle.

In the display panel according the present application, a shape of the first groove on a first cross section includes a normal trapezoid or an inverted trapezoid; and
  wherein, the first cross section is perpendicular to the bonding area and parallel to a boundary of the display panel close to the bonding area.

In the display panel according the present application, the anti-overflow portion includes a retaining wall portion located on the second planarization layer, and the retaining wall portion is disposed in a same level as a pixel definition layer in the display area.

In the display panel according the present application, the retaining wall portion includes at least one second groove to expose the terminals; and
  wherein, the second groove and the terminals are in a one-to-one correspondence.

In the display panel according the present application, the retaining wall portion further includes a third groove located between adjacent ones of the terminals, and
  a depth of the third groove is smaller than a height of the retaining wall portion.

A display device, including a display panel, a polarizer layer disposed on the display panel, and a cover layer disposed on the polarizer layer,
  wherein the display panel includes display area and a non-display area;
  wherein the non-display area includes a bonding area away from the display area, and a plurality of terminals are disposed in the bonding area; and
  wherein, the non-display area further includes an anti-overflow portion disposed around the plurality of terminals.

In the display device of the present application, the anti-overflow portion includes a continuous channel disposed around the bonding area.

In the display device of the present application, the bonding area is provided with a substrate, a first planarization layer disposed on the substrate, the plurality of terminals disposed on the first planarization layer, a second planarization layer disposed on the plurality of terminals, and the anti-overflow portion disposed on the second planarization layer; and
  wherein, the anti-overflow portion includes at least one first groove, and the first groove is evenly arranged in the non-display area except for an area where the plurality of terminals are located.

In the display device of the present application, in a top view of the display panel, a diameter of a circumcircle of the first groove between adjacent ones of the terminals is smaller than that a diameter of conductive particles in an object to be overflowed; and wherein, a difference between the diameter of the conductive particles in the object to be overflowed and the diameter of the circumcircle of the first groove is greater than 3 μm.

In the display device of the present application, a shape of the first groove on a first cross section includes a normal trapezoid or an inverted trapezoid; and wherein, the first cross section is perpendicular to the bonding area and parallel to a boundary of the display panel close to the bonding area.

In the display device of the present application, the anti-overflow portion includes a retaining wall portion located on the second planarization layer, and the retaining wall portion is disposed in a same level as a pixel definition layer in the display area.

In the display device of the present application, the retaining wall portion includes at least one second groove to expose the terminals; and wherein, the second groove and the terminals are in a one-to-one correspondence.

In the display device of the present application, the retaining wall portion further includes a third groove located between adjacent ones of the terminals, and a depth of the third groove is smaller than a height of the retaining wall portion.

The present application prevents the problem of ACF overflow by surrounding the plurality of terminals around the non-display area, which facilitates the peeling of the glass substrate and improves the yield of the product.

DETAILED DESCRIPTION OF PREFERRED EMBODIMENTS

Figure 1:
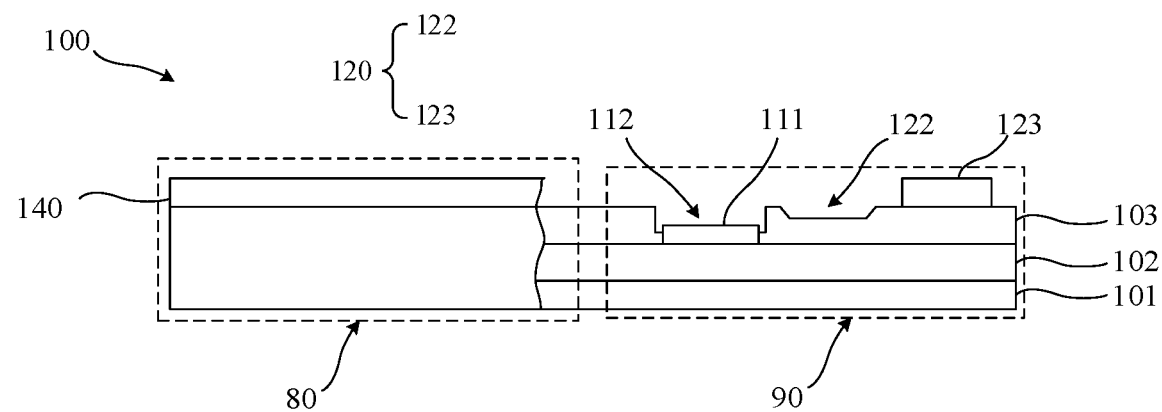
FIG. 1 is a schematic structural diagram of a display panel of the present application.

The present application provides a display panel and a display device. In order to make the purpose, technical solutions and effects of the present application clearer and definite, the present application will be described in further detail below with reference to the accompanying drawings and embodiments. It should be understood that the specific embodiments described herein are only used to explain the present application, and are not used to limit the present application.

Referring to FIG. 1 to FIG. 5, the present application proposes a display panel 100 including a display area 80 and a non-display area 90.

The non-display area 90 includes a bonding area 110 away from the display area 80, and a plurality of terminals 111 are disposed in the bonding area 110.

The non-display area 90 further includes an anti-overflow portion 120 disposed around the plurality of terminals 111.

The present application prevents the problem of ACF overflow by disposing the anti-overflow portion around the plurality of terminals in the non-display area, such that the peeling of the glass substrate is facilitated, and the yield of the product is improved.

The technical solution of the present application will be described in conjunction with specific embodiments hereafter.

Embodiment 1

Figure 2:
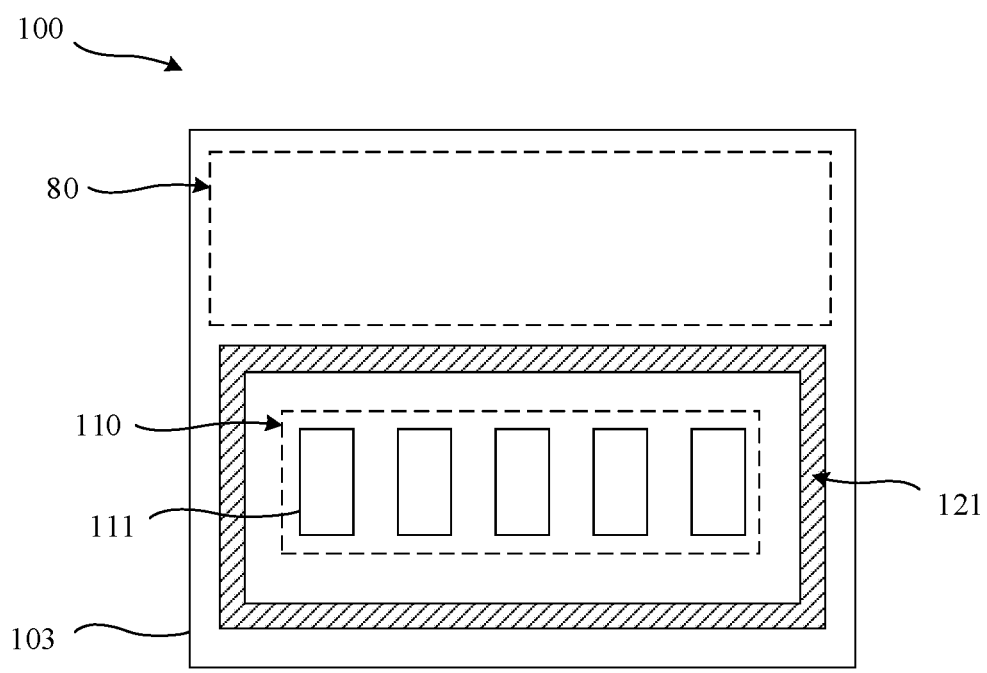
FIG. 2 is a schematic top view of a first structure of the display panel of the present application.
Figure 3:
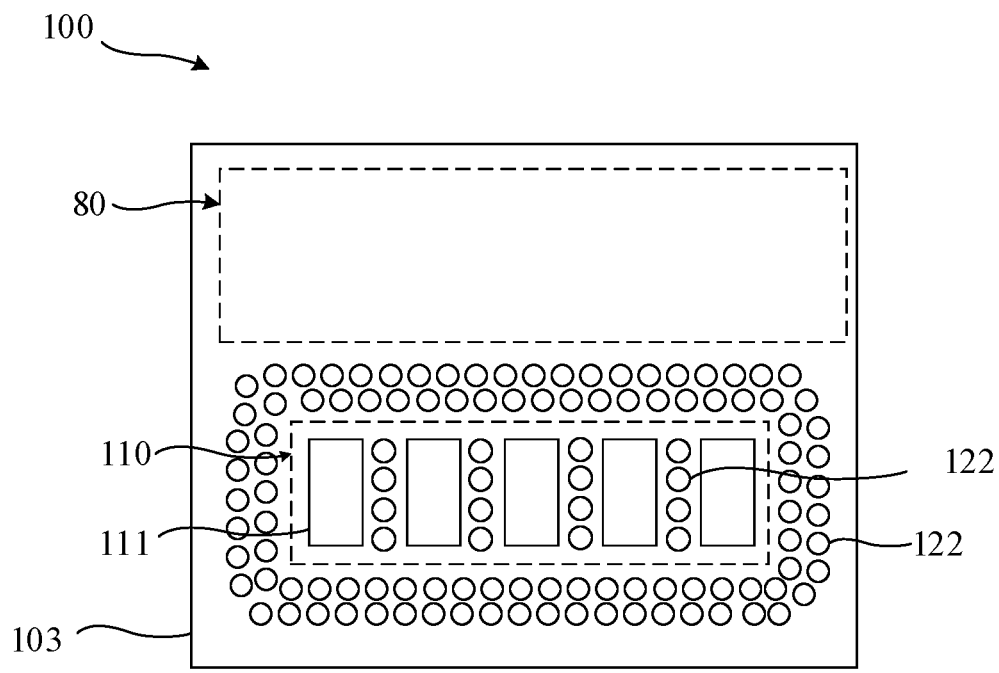
FIG. 3 is a schematic top view of a second structure of the display panel of the present application.
Figure 4:
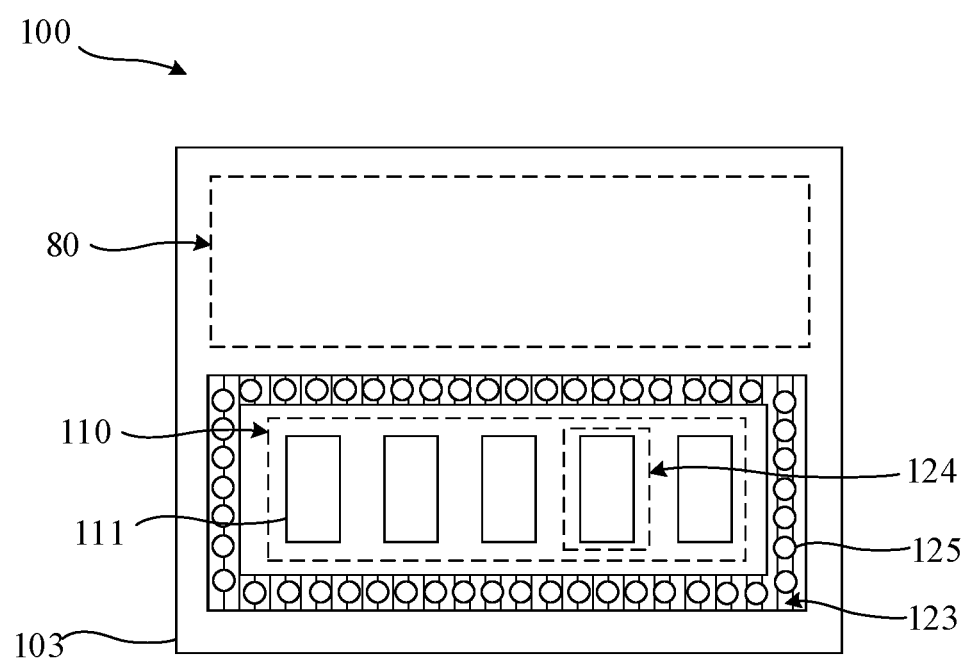
FIG. 4 is a schematic top view of a third structure of the display panel of the present application.

Referring to FIG. 1 to FIG. 3, the present application proposes a display panel 100. The display panel 100 includes a display area 80 and a non-display area 90. The non-display area 90 includes a bonding area 110 away from the display area 80, and a plurality of terminals 111 are disposed in the bonding area 110. The non-display area 90 further includes an anti-overflow portion 120 disposed around the plurality of terminals 111.

In this embodiment, the display area 80 of the display panel 100 may include a substrate, an insulating layer, a gate layer, a source/drain layer, a first planarization layer 102, a second planarization layer 103, a pixel definition layer 140, and a spacer layer disposed sequentially.

In this embodiment, the anti-overflow portion 120 includes a continuous channel 121 disposed around the bonding area 110. For details, referring to FIG. 2, through the continuous channel 121, when applying an anisotropic conductive film (ACF), the excess ACF will enter the continuous channel 121, thereby reducing the risk of ACF overflow, facilitating subsequent peeling of the glass substrate, and improving the yield of the product.

In this embodiment, the substrate 101, the first planarization layer 102 on the substrate 101, the plurality of the terminals 111 on the first planarization layer 102, and the second planarization layer 103 on the plurality of terminals 111, and the anti-overflow portion 120 on the second planarization layer 103 are disposed in the bonding area. The anti-overflow portion 120 includes at least one first groove 122, and the first groove 122 is evenly disposed in the non-display area 90 except for an area where the plurality of terminals 111 are located. Referring to FIG. 3 for details, due to the at least one first groove 122, excess ACF can be more fully left in the first groove 122 of the non-display area 90, and the second planarization layer 103 cooperates with the first groove 122 to control a flow rate of the ACF, and meanwhile prevents the ACF from flowing too fast to cause a technical problem of overflow.

In this embodiment, the terminals 111 may be electrically connected to the source/drain layer of the display area 80.

In this embodiment, the second planarization layer 103 may include at least one first via hole 112, which penetrates the second planarization layer 103 to expose each of the terminals 111. The first via hole 112 and the terminals 111 are in a one-to-one correspondence, and each of the terminals 111 can be electrically connected to a printed circuit board through the first via hole, referring to FIG. 1 for details.

In this embodiment, in a top view of the display panel 100, a diameter of a circumcircle of the first groove 122 between adjacent ones of the terminals 111 is smaller than a diameter of conductive particles in an object to be overflowed. The difference between the diameter of the conductive particles in the object to be overflowed and the diameter of the circumcircle of the first groove 122 is greater than 3 μm. By setting the diameter of the circumcircle of the first groove 122 between adjacent ones of the terminals 111 to be smaller than the diameter of the conductive particles in the object to be overflowed, during bonding, after the conductive particles are crushed, the diameter of part of the conductive particles will be reduced to enter the first groove 122, such that the distance between adjacent ones of the terminals 111 can be reduced, and within a certain length, a number of the terminals 111 will increase, thereby supporting products with higher resolution and more functions.

In this embodiment, in a top view of the display panel 100, the first groove 122 is continuously provided along the periphery of the plurality of terminals 111, referring to FIG. 3 for details. Such setting is simple and convenient, and it can be achieved at a lower manufacturing process level but effectively make excess ACF glue enter the first groove 122, thereby reducing the risk of ACF glue overflow, facilitating subsequent peeling of the glass substrate, and improving the yield.

In this embodiment, in a top view of the display panel 100, the first groove 122 is located between adjacent ones of the terminals 111, referring to FIG. 3 for details. By setting the diameter of the circumcircle of the first groove 122 between adjacent ones of the terminals 111 to be smaller than the diameter of the conductive particles in the object to be overflowed, during bonding, after the conductive particles are crushed, the diameter of part of the conductive particles will be reduced to enter the first groove 122, such that the distance between adjacent ones of the terminals 111 can be reduced, and within a certain length, a number of the terminals 111 will increase, thereby supporting products with higher resolution and more functions.

In this embodiment, in a top view of the display panel 100, the first grooves 122 are continuously provided along the periphery of the plurality of terminals 111, and the first groove 122 is located between adjacent ones of the terminals 111, referring to FIG. 3 for details. The combination of the two settings can facilitate the excess ACF to enter the first groove 122, thereby reducing the risk of ACF overflow, facilitating subsequent glass substrates, and being convenient for the subsequent crush rate of glass-based conductive particles.

In this embodiment, in a top view of the display panel 100, an opening shape of the first groove 122 on the second planarization layer 103 includes a circle, a triangle, or a rectangle. Using the principle that a circle has the largest area under the same circumference, more ACF can be filled. By using the stability of the triangle, anti-pull performance of the flexible panel can be improved while maintaining its flexibility, to avoid the possible loss of rigid strength due to the first groove 122.

In this embodiment, a shape of the first groove 122 on a first cross section includes a normal trapezoid or an inverted trapezoid, wherein the first cross section is perpendicular to the bonding area 110 and parallel to a boundary of the display panel 100 close to the bonding area 110. On a cross section perpendicular to the boundary of the display panel 100 and parallel to the display panel 100 close to the bonding area 110, when the cross section of the first groove 122 is a normal trapezoid, the opening is small, and the interior is large, which can be more filled with ACF, thus effectively reducing the problem of ACF overflow. When the cross section of the first groove 122 is an inverted trapezoid, the opening is large, and the interior is small, which can effectively slow down the flow rate of ACF, thereby preventing the ACF from flowing too fast to cause a technical problem of overflow.

In Embodiment 1, by disposing the anti-overflow groove on the second planarization layer of the non-display area, the flow rate of the ACF is effectively reduced, so that the excess ACF is left in the non-display area, thereby preventing the ACF from overflowing, facilitating the peeling of the glass substrate, and improving the yield of the product.

Embodiment 2

Referring to FIG. 1 to FIG. 5, this embodiment is the same as or similar to the Embodiment 1, except for the difference that:

the anti-overflow portion 120 includes a retaining wall portion 123 located on the second planarization layer 103.

In this embodiment, the retaining wall portion 123 and the pixel definition layer 140 in the display area 80 are arranged in the same layer. For details, refers to FIGS. 1, 4 and 5.

In this embodiment, the retaining wall portion 123 is a part of the second planarization layer 103 to serve as a protrusion of the second planarization layer 103.

In this embodiment, when the retaining wall portion 123 is located above the plurality of terminals 111, the retaining wall portion 123 includes at least one second groove 124, and the second groove 124 exposes the terminals 111. The second groove 124 and the terminals 111 are in a one-to-one correspondence. Through the second groove 124, the terminals 111 can be electrically connected to the printed circuit board, referring to FIG. 5 for details.

Figure 5:
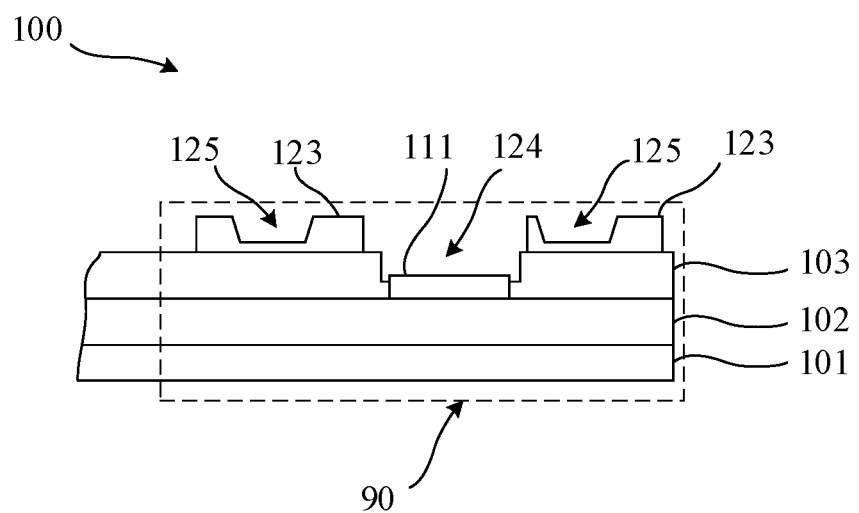
FIG. 5 is a schematic diagram of a third structure of the display panel of the present application.
Figure 6:
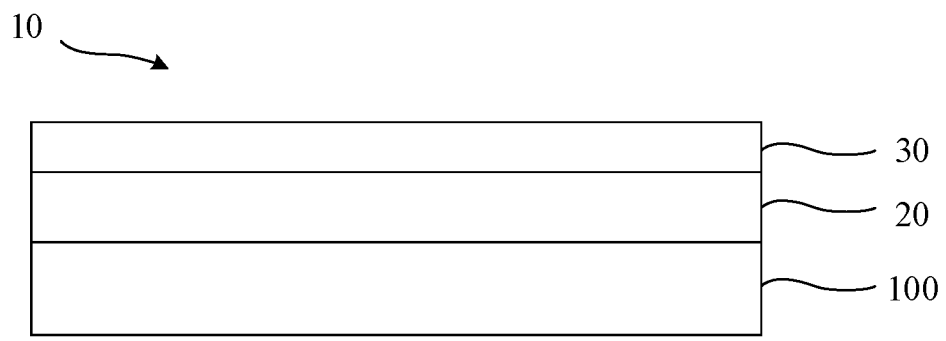
FIG. 6 is a schematic structural diagram of a display device of the present application.

In this embodiment, the retaining wall portion 123 further includes a third groove 125, referring to FIG. 5 for details. The retaining wall portion 123 cooperates with the third groove 125 to form a dam and an anti-overflow groove on the dam to reduces the flow rate of ACF better, thereby leaving excess ACF in the non-display area, and preventing the problem of ACF overflow.

In this embodiment, when the retaining wall portion 123 is located above the plurality of terminals 111, the third groove 125 is located between adjacent ones of the terminals 111. A depth of the third groove 125 is less than a height of the retaining wall portion 123, referring to FIG. 5 for details.

In this embodiment, an opening shape of the second groove 124 and/or the third groove 125 on the retaining wall portion 123 includes a circle, a triangle, or a rectangle. Using the principle that a circle has the largest area under the same circumference, more ACF can be filled. By using the stability of the triangle, anti-pull performance of the flexible panel can be improved while maintaining its flexibility, to avoid the possible loss of rigid strength due to the second groove 124 and/or the third groove 125.

In this embodiment, a shape of the second groove 124 and/or the third groove 125 on the first cross section includes a normal trapezoid or an inverted trapezoid. The first cross section is perpendicular to the bonding area and parallel to the boundary of the display panel close to the bonding area.

On a cross section perpendicular to the boundary of the display panel 100 and parallel to the display panel 100 close to the bonding area 110, when the cross section of the second groove 124/or the third groove 125 is a normal trapezoid, the opening is small, and the interior is large, which can be more filled with ACF, thus effectively reducing the problem of ACF overflow. When the cross section of the second groove 124/or the third groove 125 is an inverted trapezoid, the opening is large, and the interior is small, which can effectively slow down the flow rate of ACF, thereby preventing the ACF from flowing too fast to cause a technical problem of overflow.

In Embodiment 2, by disposing the anti-overflow groove on the second planarization layer of the non-display area, the flow rate of the ACF is effectively reduced, so that the excess ACF is left in the non-display area, thereby preventing the ACF from overflowing, facilitating the peeling of the glass substrate, and improving the yield of the product.

Referring to FIG. 1 to FIG. 6, the present application also proposes a display device 10 including any one of the above-mentioned display panels 100, and a polarizer layer 20 and the cover layer 30 which are disposed on the display panel 100.

A specific structure of the display device 10 can be referred to the details of the structure of the display panel 100 described above, which will not be repeated herein for brevity.

In summary, the present application discloses a display panel and a display device. The display panel includes a display area and a non-display area; the non-display area includes a bonding area away from the display area, and a plurality of terminals are disposed in the bonding area; and the non-display area further includes an anti-overflow portion disposed around the plurality of terminals. The present application prevents the problem of ACF overflow by disposing the anti-overflow portion around the plurality of terminals in the non-display area, such that the peeling of the glass substrate is facilitated, and the yield of the product is improved.

It can be understood that, for those of ordinary skill in the art, equivalent replacements or changes can be made according to the technical solutions and inventive concepts of the present application, and all such changes or replacements should fall within the protection scope of the claims appended to the present application.

What is claimed is:

1. A display panel, comprising a display area and a non-display area,
wherein the non-display area comprises a bonding area away from the display area, and a plurality of terminals are disposed in the bonding area;
wherein, the non-display area further comprises an anti-overflow portion disposed around the plurality of terminals;
the bonding area is provided with a substrate, a first planarization layer disposed on the substrate, the plurality of terminals disposed on the first planarization layer, a second planarization layer disposed on the plurality of terminals, and the anti-overflow portion disposed on the second planarization layer; and
wherein, the anti-overflow portion comprises at least one first groove, and the at least one first groove is evenly arranged in the non-display area except for an area where the plurality of terminals are located.

2. The display panel according to claim 1, wherein the anti-overflow portion comprises a continuous channel disposed around the bonding area.

3. The display panel according to claim 1, wherein in a top view of the display panel, a diameter of a circumcircle of the first groove between adjacent ones of the terminals is smaller than that a diameter of conductive particles in an object to be overflowed; and
wherein, a difference between the diameter of the conductive particles in the object to be overflowed and the diameter of the circumcircle of the first groove is greater than 3 μm.

4. The display panel according to claim 1, wherein the second planarization layer comprises at least one first via hole, and
the first via hole penetrates the second planarization layer to expose each of the terminals; and
wherein, the first via hole and the terminals are in a one-to-one correspondence, and each of the terminals is electrically connected to a printed circuit board of the display panel through the first via hole.

5. The display panel according to claim 1, wherein the first groove is continuously disposed along a periphery of the plurality of terminals in a top view of the display panel.

6. The display panel according to claim 1, wherein the first groove is located between adjacent ones of the terminals in a top view of the display panel.

7. The display panel according to claim 1, wherein, in a top view of the display panel, an opening shape of the first groove on the second planarization layer comprises a circle, a triangle, or a rectangle.

8. The display panel according to claim 1, wherein a shape of the first groove on a first cross section comprises a normal trapezoid or an inverted trapezoid; and
wherein, the first cross section is perpendicular to the bonding area and parallel to a boundary of the display panel close to the bonding area.

9. The display panel according to claim 1, wherein the anti-overflow portion comprises a retaining wall portion located on the second planarization layer, and the retaining wall portion is disposed in a same level as a pixel definition layer in the display area.

10. The display panel according to claim 9, wherein the retaining wall portion comprises at least one second groove to expose the terminals; and
wherein, the at least one second groove and the terminals are in a one-to-one correspondence.

11. The display panel according to claim 10, wherein the retaining wall portion further comprises a third groove located between adjacent ones of the terminals, and
a depth of the third groove is smaller than a height of the retaining wall portion.

12. A display device, comprising a display panel, a polarizer layer disposed on the display panel, and a cover layer disposed on the polarizer layer,
wherein the display panel comprises a display area and a non-display area;
wherein the non-display area comprises a bonding area away from the display area, and a plurality of terminals are disposed in the bonding area;
wherein, the non-display area further comprises an anti-overflow portion disposed around the plurality of terminals;
the bonding area is provided with a substrate, a first planarization layer disposed on the substrate, the plurality of terminals disposed on the first planarization layer, a second planarization layer disposed on the plurality of terminals, and the anti-overflow portion disposed on the second planarization layer; and
wherein, the anti-overflow portion comprises at least one first groove, and the at least one first groove is evenly arranged in the non-display area except for an area where the plurality of terminals are located.

13. The display device according to claim 12, wherein the anti-overflow portion comprises a continuous channel disposed around the bonding area.

14. The display device according to claim 12, wherein in a top view of the display panel, a diameter of a circumcircle of the first groove between adjacent ones of the terminals is smaller than that a diameter of conductive particles in an object to be overflowed; and wherein, a difference between the diameter of the conductive particles in the object to be overflowed and the diameter of the circumcircle of the first groove is greater than 3 μm.

15. The display device according to claim 12, wherein a shape of the first groove on a first cross section comprises a normal trapezoid or an inverted trapezoid; and wherein, the first cross section is perpendicular to the bonding area and parallel to a boundary of the display panel close to the bonding area.

16. The display device according to claim 12, wherein the anti-overflow portion comprises a retaining wall portion located on the second planarization layer, and the retaining wall portion is disposed in a same level as a pixel definition layer in the display area.

17. The display device according to claim 16, wherein the retaining wall portion comprises at least one second groove to expose the terminals; and wherein, the at least one second groove and the terminals are in a one-to-one correspondence.

18. The display device according to claim 17, wherein the retaining wall portion further comprises a third groove located between adjacent ones of the terminals, and a depth of the third groove is smaller than a height of the retaining wall portion.

\* \* \* \* \*